United States Patent
Sigtermans et al.

(10) Patent No.: US 11,526,084 B2
(45) Date of Patent: Dec. 13, 2022

(54) DETERMINING SIGNIFICANT RELATIONSHIPS BETWEEN PARAMETERS DESCRIBING OPERATION OF AN APPARATUS

(71) Applicant: ASML Netherlands B.V., Veldhoven (NL)

(72) Inventors: David Evert Song Kook Sigtermans, Veldhoven (NL); Marcel Richard André Brunt, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 22 days.

(21) Appl. No.: 17/251,568

(22) PCT Filed: May 15, 2019

(86) PCT No.: PCT/EP2019/062512
§ 371 (c)(1),
(2) Date: Dec. 11, 2020

(87) PCT Pub. No.: WO2019/238348
PCT Pub. Date: Dec. 19, 2019

(65) Prior Publication Data
US 2021/0325789 A1 Oct. 21, 2021

(30) Foreign Application Priority Data
Jun. 15, 2018 (EP) ...................................... 18177970

(51) Int. Cl.
*G03F 7/20* (2006.01)
*G05B 13/04* (2006.01)

(52) U.S. Cl.
CPC ...... *G03F 7/70508* (2013.01); *G03F 7/70525* (2013.01); *G05B 13/042* (2013.01)

(58) Field of Classification Search
CPC ............. G03F 7/70508; G03F 7/70525; G03F 7/70533; G05B 13/042; G05B 23/024
See application file for complete search history.

(56) References Cited

U.S. PATENT DOCUMENTS 6,458,610 B1 * 10/2002 Lensing .................. H01L 22/20
257/E21.525
6,952,253 B2 10/2005 Lof et al.
(Continued)

FOREIGN PATENT DOCUMENTS

| JP | 2009-124101 A | 6/2009 |
| JP | 2013-074294 A | 4/2013 |

(Continued)

OTHER PUBLICATIONS

International Search Report and Written Opinion of the International Searching Authority directed to related International Patent Application No. PCT/EP2019/062512, dated Jun. 21, 2019; 9 pages.
(Continued)

*Primary Examiner* — Mesfin T Asfaw
(74) *Attorney, Agent, or Firm* — Sterne. Kessler. Goldstein & Fox P.L.L.C.

(57) ABSTRACT

Methods and apparatus for determining a subset of a plurality of relationships between a plurality of parameters describing operation of a lithographic apparatus, the method comprising: determining a first set of data describing first relationships between a plurality of parameters of a reference apparatus; based on one or more measurements, determining a second set of data describing second relationships between the plurality of parameters of the reference or a further apparatus; comparing the first set of data and the second set of data; and selecting from the second set of data a subset of the second relationships based on differences between the first set of data and the second set of data.

15 Claims, 6 Drawing Sheets

(56) References Cited

U.S. PATENT DOCUMENTS

| | | | |
|---|---|---|---|
| 7,460,237 B1 | 12/2008 | Cramer | |
| 9,291,916 B2 | 3/2016 | Van Der Sanden et al. | |
| 10,156,796 B2 | 12/2018 | Saïb et al. | |
| 2008/0243295 A1* | 10/2008 | Winkler | G05B 23/0264 |
| | | | 700/121 |

FOREIGN PATENT DOCUMENTS

| | | |
|---|---|---|
| JP | 2017-520021 A | 7/2017 |
| WO | WO 2017/055073 A1 | 4/2017 |
| WO | WO 2017/182269 A1 | 10/2017 |

OTHER PUBLICATIONS

International Preliminary Report on Patentability directed to related International Patent Application No. PCT/EP2019/062512, dated Dec. 15, 2020; 7 pages.

Schreiber, T. "Measuring Information Transfer," American Physical Society, Physical Review Letters, vol. 85, No. 2, Jul. 10, 2000; pp. 461-464.

Kawamura et al., "Log data extraction and correlation miner for lithography management system: LMS-LEC," Proc. of SPIE vol. 5755, Data Analysis and Modeling for Process Control II, May 17, 2005; pp. 231-235.

Tsuda et al., "Improvement of Photolithography Process by Second Generation Data Mining," IEEE Transactions on Semiconductor Manufacturing, vol. 20, No. 3, Aug. 2007; pp. 239-244.

\* cited by examiner

| | P1 | P2 | P3 | P4 | P5 |
|---|---|---|---|---|---|
| P1 | 1 | 1 | 1 | 1 | 0 |
| P2 | 0 | 1 | 0 | 0 | 1 |
| P3 | 1 | 0 | 1 | 0 | 1 |
| P4 | 0 | 1 | 0 | 1 | 1 |
| P5 | 0 | 1 | 0 | 0 | 1 |

DETERMINING SIGNIFICANT RELATIONSHIPS BETWEEN PARAMETERS DESCRIBING OPERATION OF AN APPARATUS

CROSS-REFERENCE TO RELATED APPLICATIONS

This application claims priority of EP application 18177970.3 which was filed on 15 Jun. 2018 and which is incorporated herein in its entirety by reference.

FIELD

The present invention relates to the methods and systems for selecting a subset of relationships from a plurality of relationships describing operation of an apparatus. In specific arrangements, the apparatus may be a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD = k1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

A lithographic apparatus (or other apparatus such as n inspection or metrology apparatus) can be a complex comprising many components interacting in the apparatus. Maintenance of the different components may be required to help the apparatus function effectively and predictive maintenance methods can be used to determine when to perform maintenance of the whole or a portion of the machine. Lithographic apparatus can be described using a plurality of parameters, which may be based on measurements relating to the apparatus. Some of the parameters may be interrelated, and relationships between the parameters can be used to describe and analyse the apparatus. The relationships between parameters describing the apparatus may be causal relationships. The existence of causal relationships between parameters of an apparatus may be determined using methods and apparatuses as set out in WO2017/055073A1. Analysis of these relationships can be used to determine when maintenance of the whole or a part of the apparatus is required, for example as set out in WO2017/182269A1. The contents of WO2017/055073A1 and WO2017/182269A1 are incorporated herein by reference.

SUMMARY

According to an aspect of the invention there is provided a method of determining a subset of a plurality of relationships between a plurality of parameters describing operation of an apparatus for use in semiconductor manufacture, the method comprising: determining a first set of data describing first relationships between a plurality of parameters of a reference apparatus for use in semiconductor manufacture, based on one or more measurements, determining a second set of data describing second relationships between the plurality of parameters of the reference or a further apparatus for use in semiconductor manufacture; comparing the first set of data and the second set of data; and selecting from the second set of data a subset of the second relationships based on differences between the first set of data and the second set of data.

Optionally, one or more of the relationships are causal relationships.

Optionally, the first set of data is based on a first set of one or more measurements undertaken on the reference apparatus for use in semiconductor manufacture, and wherein the second set of data is based on a second set of one or more measurements undertaken on the reference or the further apparatus for use in semiconductor manufacture.

Optionally, the method further comprises calculating, based on the first set of one or more measurements, first frequency data relating to one or more of the plurality of parameters of the reference apparatus for use in semiconductor manufacture, and calculating, based on the second set of one or more measurements, second frequency data relating to one or more of the plurality of parameters of the reference or the further apparatus for use in semiconductor manufacture.

Optionally, the method further comprises comparing the first frequency data to the second frequency data, and selecting one or more parameters of the plurality of parameters of the reference or further apparatus for use in semiconductor manufacture based on the comparison between the first frequency data and the second frequency data.

Optionally, a parameter is selected if a difference between the first frequency data and the second frequency data for that parameter is greater than a threshold value.

Optionally, selecting the subset of the second relationships further comprises determining, from the second set of data, one or more relationships relating to at least one of the selected parameters of the reference or further apparatus.

Optionally, the first frequency data and second frequency data are calculated based on a result of the comparison of the first set of data and the second set of data.

Optionally, the second set of data relates to the reference apparatus at a different time to the first set of data.

Optionally, the second set of data relates to the further apparatus for use in semiconductor manufacture, and wherein the further apparatus for use in semiconductor manufacture is an apparatus corresponding to the reference apparatus for use in semiconductor manufacture.

Optionally, the first set of data is calculated based on information relating to a design of the reference apparatus for use in semiconductor manufacture.

Optionally, the first set of data comprises a design structure matrix.

Optionally, one of the first and/or second sets of data comprises at least one of a causal graph and data stored in respective matrices.

According an aspect of the invention there is provided a computer program comprising instructions which, when executed on at least one processor, cause the at least one processor to control an apparatus to carry out a method according to any disclosed herein.

According to an aspect of the invention, there is provided an apparatus for determining a subset of a plurality of relationships between a plurality of parameters describing operation of an apparatus for use in semiconductor manufacture, the apparatus comprising a processor configured to execute computer program code to undertake the method of: determining a first set of data describing first relationships between a plurality of parameters of a reference apparatus for use in semiconductor manufacture; based on one or more measurements, determining a second set of data describing second relationships between the plurality of parameters of the reference or a further apparatus for use in semiconductor manufacture; comparing the first set of data and the second set of data; and selecting from the second set of data a subset of the second relationships based on differences between the first set of data and the second set of data.

According to an aspect of the invention, there is provided an apparatus for use in semiconductor manufacture comprising any apparatus for determining a subset of a plurality of relationships between a plurality of parameters disclosed herein.

According to an aspect of the invention, there is provided a lithographic cell system comprising the apparatus for use in semiconductor manufacture.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
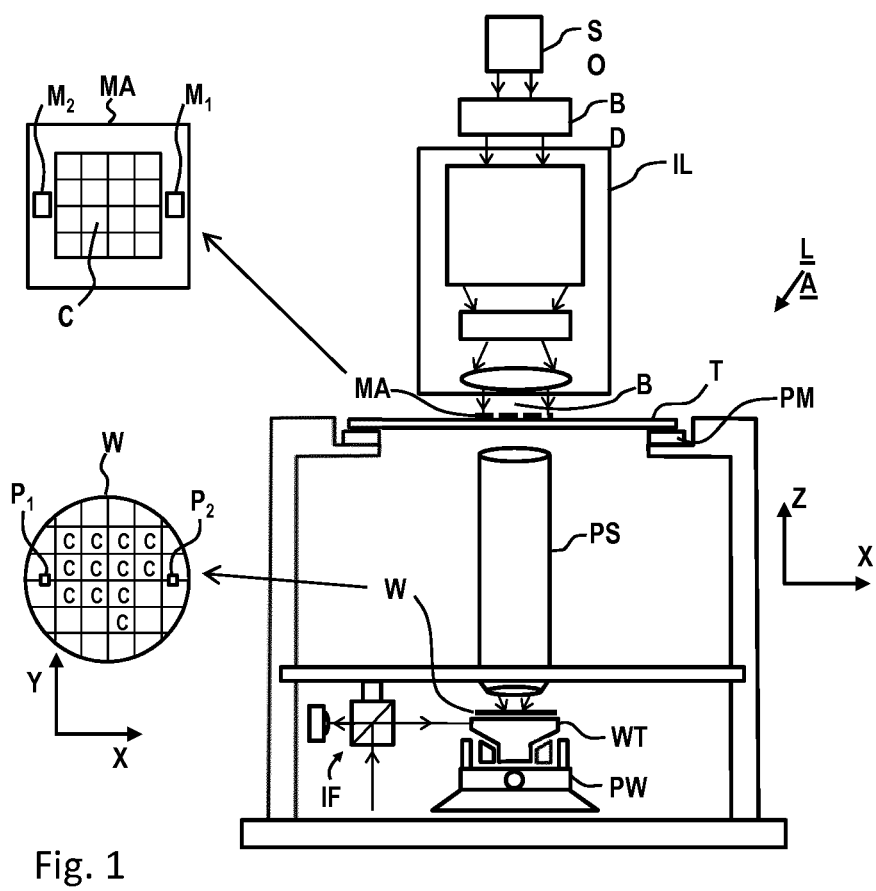
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
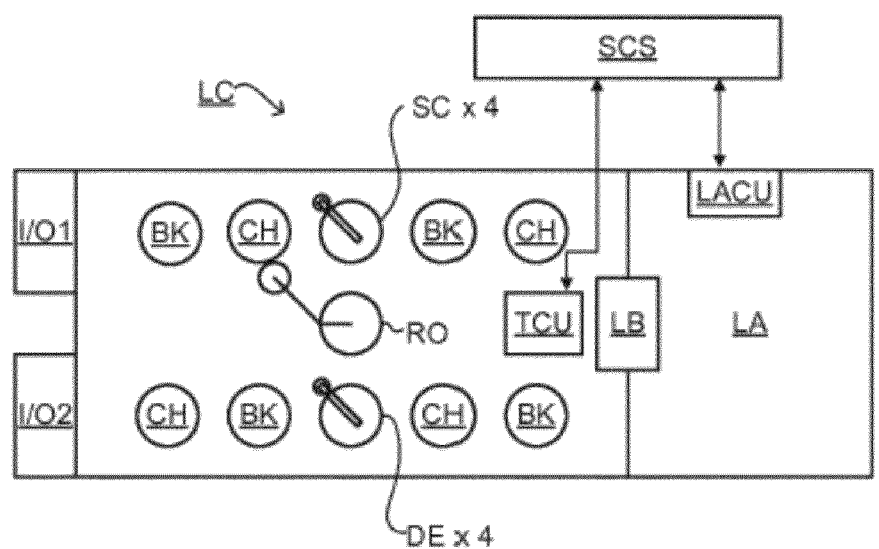
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
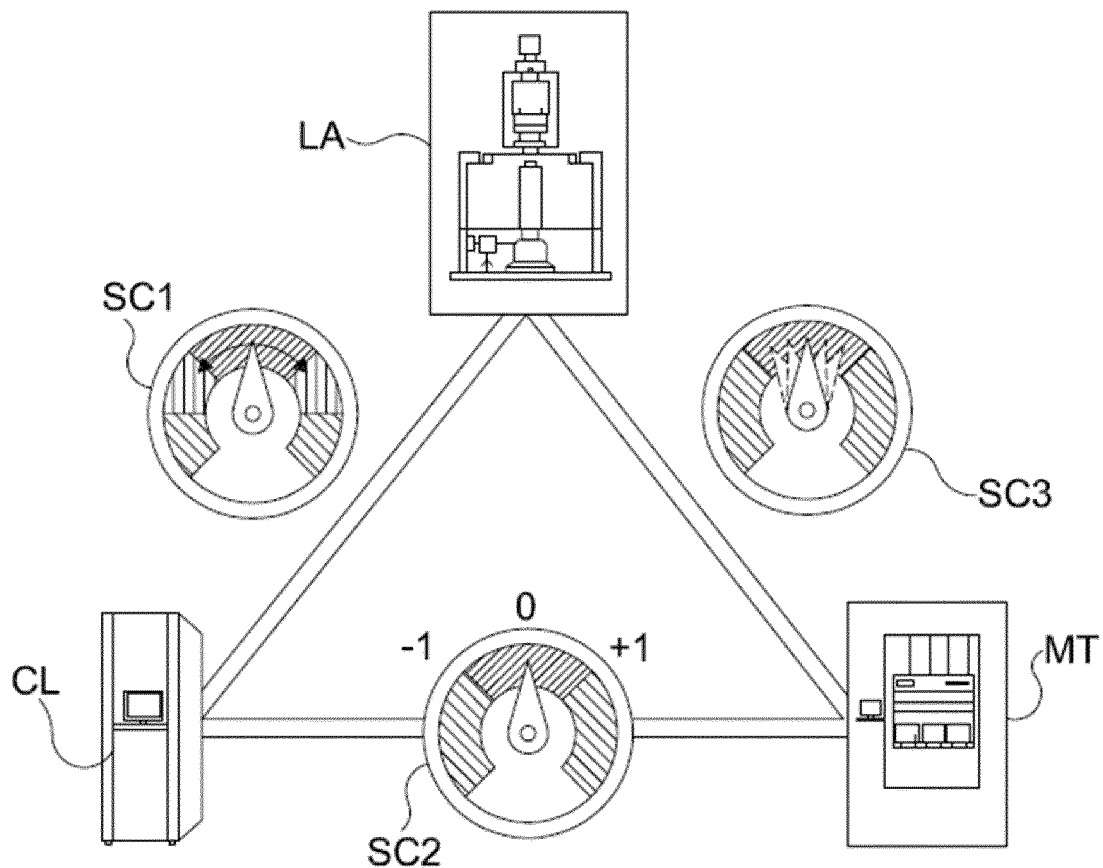
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA, lithographic cell LC, and metrology tool MT all produce large amounts of data, which can be used to diagnose complex issues in a system. The system in this instance may comprise one or more of the whole or portions of the lithographic apparatus LA, the lithographic cell LC, the metrology tool MT, connections between them, and/or other features. It is also noted that the system may optionally comprise an inspection apparatus and/or any apparatus used in semiconductor manufacturing of integrated circuits. The data relating to the system may comprise but is not limited to data relating to one or more components of the lithographic apparatus LA, including an illumination system IL, radiation source SO, beam delivery system BD, radiation beam B, mask support, substrate support, patterning device, substrate positioner, patterning device positioner, projection system PS, measurement stage with sensor and/or cleaning device; data relating to one or more components of the lithographic cell LC, including spin coaters SC, developers, DE, chill plates CH, bake plates BK, substrate handlers, control units, control systems, and inspection tools; and/or data relating to and/or obtained by a metrology tool. Analysis of the data may be used to determine changes of the data over time indicating when maintenance of one or more components or parts of the system to which the data relates should be performed.

Such data can be combined in a data set. The data in a set may have a structure, for example, the data may relate to a plurality of parameters of the system or apparatus. The parameters may comprise measurement values of one or more sensors within an apparatus, one or more setting values for an apparatus, one or more user input values, one or more values representing control signals for controlling the operation of parts of the apparatus etc. More specific examples of parameters may include positioning errors exceeding thresholds, motor currents exceeding limits, spikes in motor current, power spectral density in small frequency band above limits, sudden changes in average values, sudden changes in average slope values and any of the above in combination with e.g. temperatures, pressures, flows, humidity, voltages, currents, velocities, accelerations, torques, forces etc. The skilled person will envisage other values that may be used as parameters herein.

The parameters may describe the whole or a part of the operation of the system or apparatus, for example a lithographic apparatus LA. The data set may describe relationships between parameters of the system or apparatus and may comprise several values for each parameter that have been measured over a period of time. The relationships described by the data set may be causal relationships between parameters of a system or apparatus. Parameters and any relationships, such as causal relationships, between them may be represented in a graph, which may be a causal graph. A causal graph may result from causal inference based on measurements or other data. Parameters and relationships may alternatively be represented in a matrix. In other arrangements, parameters and relationships may be represented using any other appropriate method.

The data set may describe a large amount of parameters, and a large amount of relationships between them. The amount of possible relationships between parameters in a data set scales with the square of the amount of parameters. The data set contains large amounts of information about the system. As a lithographic apparatus LA, lithographic cell LC, metrology tool MT, and associated structures are highly complex, analysing and monitoring every aspect and component of these systems would require a large amount of time and effort. Therefore, it is desirable to make an informed selection of a subset of parameters of the system to analyse or monitor in more detail. It may for example, be desirable to monitor such elements of the system which exhibit changing or unexpected behaviour. It may also be desirable to monitor any component or element of the system indicating an error, fault, or problem. The large data set may contain data on several parameters over time, and relationships between parameters. Analysis of the data set may allow selection of a subset of parameters and relationships to be monitored more closely. For example, the data set may be analysed to determine and select any unexpected changes in parameter and relationship data.

Figure 4:
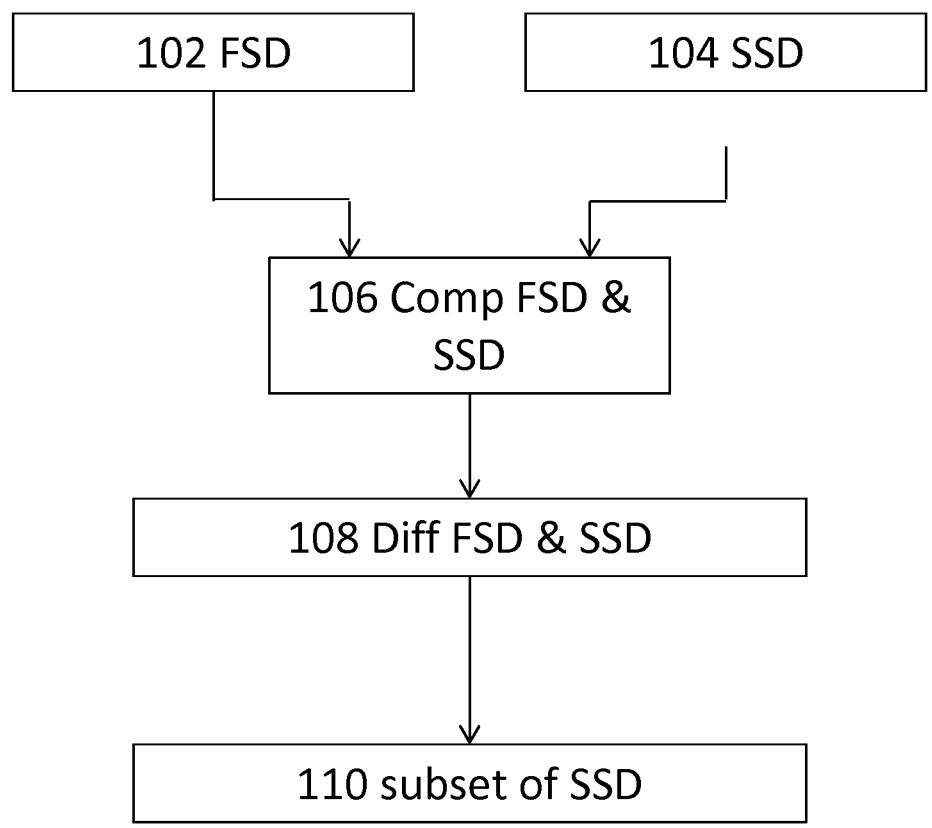
FIG. 4 depicts a flow diagram of a method for determining a subset of relationships between parameters of an apparatus.

FIG. 4 shows a flow diagram of a method of determining a subset of a plurality of relationships in a data set. The relationships in the data set may be relationships between parameters describing operation of an apparatus, such as a lithographic apparatus. The data set describing relationships between parameters in the data set may also be referred to as relationship data.

A relationship has associated parameters, wherein associated parameters of a relationship are understood to encompass the parameters between which that relationship exists. For example, a first measured parameter may be affected by a second measured parameter according to a relationship. In such a case, the first and second parameters are the associated parameters for the relationship.

The exemplary method of FIG. 4 determines a first set of data (FSD) 102 which describes first relationships between a plurality of parameters of a reference apparatus. The method also determines a second set of data (SSD) 104 which describes second relationships between a plurality of parameters, wherein the parameters may relate to the reference apparatus or to a further apparatus. The first and/or second relationships may be causal relationships. The second set of data is based on one or more measurements. As explained below in more detail, exemplary methods and apparatus may be used to assess performance or operation of the same apparatus at different times or to assess the performance or operation of a further apparatus corresponding to the reference apparatus. A corresponding apparatus in this context encompasses an apparatus used for the same purpose that may have been manufactured to the same or a similar design as the reference apparatus. In other examples, the first data set may have been generated by a designer based on a model of the performance or operation of an apparatus and the second set of data may have been determined by obtaining measurements in an example of the same apparatus. In such arrangements, the methods and apparatus disclosed herein may provide information on relationships between parameters that the model may not have predicted.

In step 106, the method compares the first set of data with the first set of data (comp FSD & SSD). The comparison leads to the determination of differences 108 between the first set of data and second set of data (diff FSD & SSD). In step 110 the method selects a subset of the second relationships from the second set of data (subset of SSD), based on the determined differences between the first and second data sets. In addition to selecting the subset of relationships, the method may also involve selecting the associated parameters related to the selected relationships.

By selecting a subset of parameters based on the difference between the first and second sets of data, the amount of computational burden in assessing the relationships between parameters in an apparatus may be reduced. In this sense, the subset may be considered as a set of significant parameters in that they provide useful information on the operation of a system or apparatus.

As mentioned above, the first and/or second relationships may be causal relationships. A causal relationship may encompass an indication of the existence of a causal link from a first parameter to a second parameter, that is to say, a first parameter may have a causal relationship with a second parameter if a change in the first parameter causes a change in the second parameter. Causal relationships are directional from one parameter to another parameter. It is possible for a first parameter to have a causal relationship with a second parameter, while that second parameter does not have a causal relationship with the first parameter. For example, temperature may affect dose, while dose does not affect temperature. Alternatively, a causal relationship may be bidirectional. A causal relationship may also encompass an indication of the absence of a causal link between two parameters. That is, if a change in a first parameter does not cause a change in a second parameter then that may still be defined as a causal relationship.

Figures 5A, 5B:
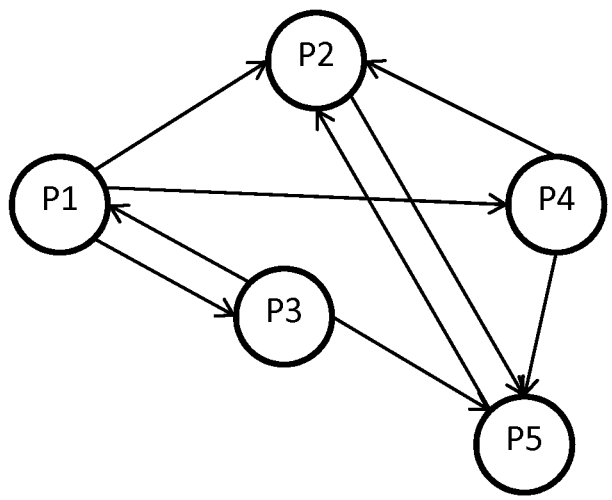
FIG. 5a depicts a schematic diagram of a set of data represented in a graph.
FIG. 5b depicts a schematic overview of a set of data represented in a matrix.

One or both of the first set of data and the second set of data may be stored in a graph, such as a causal graph as shown in FIG. 5a. In the graph of FIG. 5a, parameters P1, P2, P3, P4, and P5 are represented by nodes. The relationships between parameters P1-P5 are represented by edges between the nodes. The edges in the graph of FIG. 5a are directional, forming an arrow from one node to another node. A node representing a parameter may represent multiple values of that parameter, for example if multiple values of the parameter are contained within the data set.

An apparatus for use in semiconductor manufacture, such as a lithographic, metrology or inspection apparatus, can be described as a causal graph in terms of a network of driving and responding parameters (or observables), i.e. cause and effect relationships. The concept of transfer entropy may be used to determine causal relationships between pairs of parameters. This enables a causal mapping of the parameters, from which fault to failure paths and root exceptions can be determined.

Transfer entropy enables the inference of a causal graph for a network of parameters through computation of information transfer in bits between any pair of simultaneously observed, and possibly coupled, time series. The time series may come from, for example, event log data, performance parameters, board dumps, test data, metrology data or trace data. The resulting transfer entropy is able to distinguish driving and responding observables and detect time-asymmetry in their interactions. Being a non-parametric measure, capable of identifying arbitrary linear and non-linear causal effects without the need of a model, transfer entropy can effectively gain a better understanding of the underlying dynamics of the apparatus for use in semiconductor manufacture. This will aid accurate failure diagnosis and prognosis, as well as structural design improvements. This can be achieved through:

reconstruction of lithographic apparatus causal connectivity from observed time series;
analysis of fault evolution and propagation paths;
analysis of lithographic apparatus control performance; and/or
observability analysis of lithographic apparatus observables from measured time series.

Transfer entropy is a directional measure of asymmetrical information flow and is described in "Measuring Information Transfer" by Schreiber T. (Physical Review Letters 85 (2): 461-464), which is herein incorporated by reference in its entirety. Transfer entropy is a measure of the entropy difference between a future observation based solely on previous values for that observation (its own past), and a corresponding future observation based on previous values for that observation and previous values for another observation (its own past and the past of another observation). In other words, transfer entropy from a process X to another process Y is the amount of uncertainty reduced in future values of Y by knowing the past values of X given past values of Y.

In information theory, entropy (more specifically, Shannon entropy) is a measure of the expected value (average) of the information contained in each message (e.g. an event or value within a time series or other data stream) received. More specifically, Shannon entropy $H(Y_t)$ describes the average number of bits needed to optimally encode independent draws of the discrete variable $Y_t$ following a probability distribution p(y):

$$H(Y_t) = -\Sigma_{y \in Y_t} p(y) \log(p(y)) \qquad (1)$$

Transfer entropy T can be described as:

$$T(X_t > Y_{t,\tau,k,l,\omega}) = \sum_{y_t, y_{t-\omega\Delta t}^{[k]}, x_t^{[l]}} p(y_t, y_{t-\omega\Delta t}^{[k]}, x_{t-\tau\Delta t}^{[l]}) \log \frac{p(y_t \mid (y_{t-\omega\Delta t}^{[k]}, x_{t-\tau\Delta t}^{[l]}))}{p(y_t \mid y_{t-\omega\Delta t}^{[k]})} \qquad (2)$$

where p(a,b) is the joint probability of events a and b occurring at the same time, and p(b|a) is the conditional probability which equals p(a,b)/p(a). $y_t^{[k]}$ and $x_t^{[l]}$ are the immediate history of time series $X_t$ and $Y_t$ of time interval k and l respectively. In the above the lag parameter ω accounts for the situation that the k length history of $Y_t$ that provides the most information about $Y_t$ may not be its immediate history at ω=1 but is located ω>1 time steps earlier (time steps are in units of $\Delta_t$ or $d_t$). Similarly the time lag τ, allows consideration of l length history of $X_t$ at a distance t that provides additional information over and above what is contained in $Y_t$'s own history. T measures the reduction in the uncertainty of the current state of $Y_t$ which is gained from the l length history of $X_t$ that is not present in the k length history of $Y_t$ itself.

Assuming l=k=ω=1, and time lag τ is an unknown to be determined, then the equation for transfer entropy T can be simplified to:

$$T(X_t > Y_{t,\tau}) = \sum_{y_t, y_{t-1}, x_{t-\tau}} p(y_t, y_{t-1}, x_{t-\tau}) \log \frac{p(y_t \mid y_{t-1}, x_{t-\tau})}{p(y_t \mid y_{t-1})} \qquad (3)$$

In this recital, transfer entropy T is a measure of the information contributed to $y_t$ by $x_t$ across time lag τ additional to that contributed by $y_{t-1}$. By computing T across many time lags, it is possible to assess the time scale of directional coupling from $X_t$ to $Y_t$. Equation (7) can be written in an alternative form, in terms of component Shannon entropies H:

$$T(X_t > Y_{t,\tau}) = H(X_{t-\tau}, Y_{t-1}) + H(Y_t, Y_{t-1}) - H(Y_{t-1}) - H(X_{t-\tau}, Y_t, Y_{t-1}) \qquad (4)$$

where (for example) H(X, Y) is the joint entropy between two parameters X and Y. It should be noted that other measures of entropy, in the information theory sense, can be used in determination of transfer entropy. The use of Shannon entropy is only an example.

A value for transfer entropy T can be calculated for all pairs of parameters (this should be in both directions, as transfer entropy is asymmetric) based on sets of time series for a plurality of parameters. This may be performed for multiple time lags using Equation (2), Equation (3) or Equation (4), for example.

The statistical significance of each calculated transfer entropy value can be calculated. This is a test of whether a parameter relationship described by a transfer entropy value is stronger than that which would occur through random chance between unrelated time series. This can be done by comparing each transfer entropy value T to a significance threshold $T_s$. The significance threshold $T_s$ may be determined based on a shuffled surrogate transfer entropy. Where T describes the transfer entropy between time series $X_t$ and $Y_t$, the shuffled surrogate transfer entropy will be the transfer entropy of time series $X_s$ and $Y_s$, where time series $X_s$ and $Y_s$ are randomly shuffled (in time) versions of time series $X_t$ and $Y_t$, respectively. This shuffling destroys time correlations between the time series. Only if the transfer entropy value T is greater than the significance threshold $T_s$, is it presumed that there is significant flow of information between the relevant parameters. Transfer entropy values that fall below the significance threshold $T_s$ cannot be considered statistically meaningful for the establishment of a significant coupling. In a particular method, shuffled surrogate transfer entropies are calculated for a number of realizations of shuffled time series $X_s$ and $Y_s$, resulting in a Gaussian distribution of surrogate transfer entropies. The significance threshold $T_s$ can then be based on the mean of this Gaussian distribution; for example it can be set at a number of standard deviations above the mean.

A synchronization ratio $T_z$ can be calculated, to help determine the reasons behind an observation that two parameters share a significant amount of information at a given time scale. The synchronization ratio $T_z$ may be a ratio of the calculated transfer entropy between the two parameters and a measure of shared information between the two parameters.

The characteristic time lag for each identified coupling (each transfer entropy value) can be calculated. This can be the first statistically significant time lag, or else the time lag for which the transfer entropy T is highest (assuming it is statistically significant).

Given a number of parameters, it is possible to construct a process network by casting each parameter as a node in the network and computing the transfer entropy between each node. Links (in each direction) can be shown between nodes where statistically significant coupling has been shown to exist. The process network can also indicate the coupling strength (value of the transfer entropy) and the coupling characterization. A causal matrix may be constructed, where each cell indicates whether there is a directional coupling between two nodes. The causal matrix may be a three dimensional matrix $[n_p \times n_p \times n_\tau]$, where $n_p$ is the number of parameters and $\eta_\tau$ is the number of time lags studied. However, to keep the calculations more manageable, a two dimensional matrix $[n_p \times n_p]$ can be used, comprising values of transfer entropy for each entry which corresponds to the characteristic time lag for that coupling, as determined in the previous step.

The causal matrix may be displayed, for example, as a circular directional chart (nodes and connections), a bubble chart and/or a heat map. In a bubble chart or a heat map, the causal strength (transfer entropy value) may be represented by the bubble diameter or color respectively.

One or both of the first set of data and second set of data may be stored in a matrix, as shown in FIG. 5b. For example, a row and/or a column of a matrix may represent a parameter. In FIG. 5b, rows 1-5 represent parameters P1-P5, and column 1-5 represent parameters P1-P5. An element in a matrix may represent a relationship between the parameters represented by the row and column on which the element is placed. In FIG. 5b, an element indicates if a relationship exists between the parameter of its row to the parameter of its column. The value of the element in the matrix may indicate the existence or non-existence of a relationship between the parameters, for example a causal relationship. For example, in FIG. 5b, the existence of a causal effect between the parameter of the row to the parameter of the column is indicated by a 1, and the absence of this causal effect is indicated by a 0. It is possible for a set of data to be represented in both a graph and a matrix. It may be possible to translate a matrix of a data set into a graph, and/or a graph of a data set into a matrix. The graph of FIG. 5a may be translated into the matrix of FIG. 5b and vice versa. For example, a causal graph may be translated into a Design Structure Matrix (DSM) for an apparatus.

Figure 6:
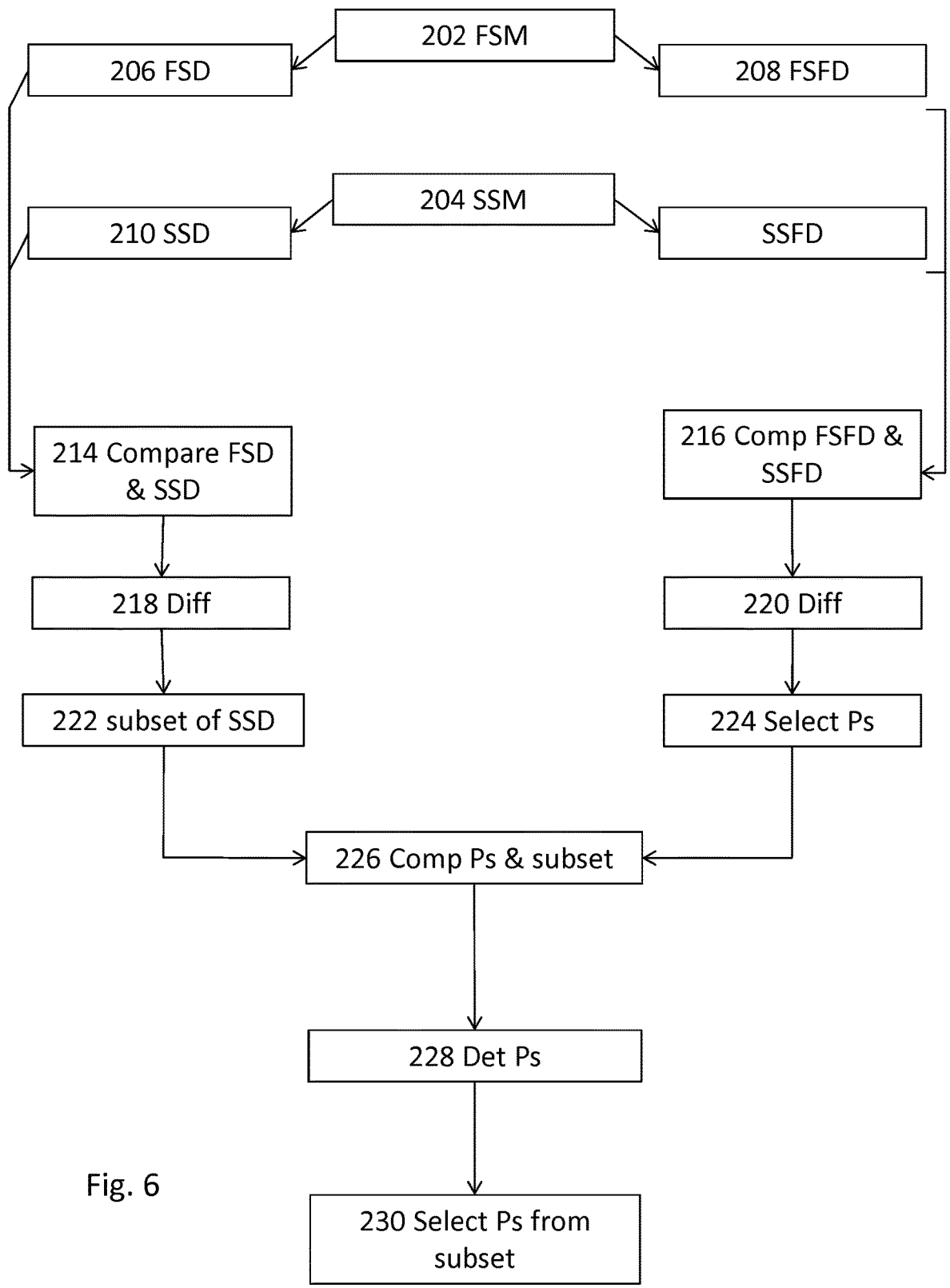
FIG. 6 depicts a flow diagram of a method for determining a subset of relationships based on a comparison of relationship data and frequency data.

FIG. 6 shows a flow diagram of a method for determining a subset of relationships in a data set. In the example of FIG. 6, the first set of data (FSD) is determined 206 from a first set of one or more measurements (FSM) 202 undertaken on the reference apparatus. The second set of data (SSD) is based on and determined 210 from a second set of one or more measurements (SSM) that may be undertaken 204 on the reference apparatus or the further apparatus. The first and/or second sets of measurements may include measurements taken by the reference apparatus itself, or by other measurement equipment active on the reference apparatus. The first and second sets of measurements may be taken in the same manner, for example they may be similar in one or more of using the same type of metrology tools, using the same number of measurements for a corresponding parameter, taken over or for the same duration.

The first set of data and second set of data may comprise corresponding parameters, that is to say, a parameter in the first set of data may have a corresponding parameter in the second set of data. For example, both of the first and second sets of data may have a parameter relating to the temperature in the reference apparatus or further apparatus. The first set of data, which comprises first relationships that may be causal relationships, is compared to the second set of data, comprising second relationships which may be causal relationships, in step 214 (comp FSD & SSD) of the flow diagram shown in FIG. 6. The comparison of the two sets may involve the comparison of corresponding parameters and/or relationships between corresponding parameters. The comparison may include the identification and determination of differences (diff) 218 in the relationships between parameters in the first and second data sets. For example, the first set of data may comprise a relationship from a first parameter to a second parameter, while a relationship from the first to the second parameter is not present in the second set of data.

In step 222 the method selects a subset, from the second set of data, (subset SSD) of relationships based on the differences determined in step 218 between the first and second relationships. The selection of the subset may comprise the selection of relationships not present in the second set of data that are present in the first set of data and/or the selection of relationships present in the second set of data that are not present in the first set of data. Exemplary methods may select all relationships present in one of the first and second sets of data that are not present in the other of the first and second sets of data. The method may further include selecting the parameters related to the selected relationships of the first subset. The selected parameters may be included in a subset of selected parameters.

The method set out in FIG. 6 further comprises determining a set of first frequency data (FSFD) 208 based on the first set of measurements. The method further comprises determining a set of second frequency data (SSFD) 212 based on the second set of measurements. The first and/or second frequency data may be determined based on a frequency analysis of a measurement of a parameter over time.

A set of frequency data may comprise frequency data for at least one of the parameters of the set of data. The set of frequency data may comprise frequency data for a plurality of parameters of a set of data. The frequency data may be a power spectral density of that parameter. The power spectral density may be calculated based on a set of values of that parameter taken at different times, wherein the set of values for that parameter are comprised in the data set.

In step 216 of the method shown in FIG. 6, the first frequency data of the first set of data and the second frequency data of the second set of data are compared (comp FSFD & SSFD). The comparison may involve, for one or more parameters for which frequency data has been determined, the comparison of the first frequency data of that parameter and the second frequency data of that parameter. The comparison of frequency data for a parameter may encompass the comparison of power spectral densities of the first and second data sets for that parameter. The method determines 220 differences (diffs) between the first and second frequency data sets. The determination of differences 220 based on the comparison may include an analysis and a decision step in which it is determined, based on the nature of the difference, whether or not an identified difference is substantial or insignificant. The determination of differences may be based on design knowledge of the apparatus and/or a breakdown of budgets and knowledge of how much a power spectral density of a parameter under consideration contributes operation of the apparatus. A pragmatic approach may be used wherein limits are determined and set in a data exploration process during which normal vs abnormal behaviour of the apparatus is observed.

The analysis of identified differences to decide on the significance of a difference may be based on the magnitude of the difference, for example the magnitude of a difference as a percentage of the total magnitude of the frequency data. A difference between first frequency data and second frequency data may be determined to be substantial if the magnitude of the difference is greater than a threshold value. A threshold value may be provided to the method for each parameter which has frequency data. The threshold value may be changed to affect the sensitivity of the frequency analysis. Tests may be performed with several threshold values to determine a preferred threshold value for use. The threshold value may be determined as set out in the previous paragraph.

Based on the identified differences and analysis of the significance of these differences, one or more parameters are selected (select Ps) 224 comprising parameters for which the first and second frequency data is different. If it is decided the difference in the first and second frequency data for a parameter are not significant, that parameter might not be included in the selected one or more parameters. If the identified difference for a parameter is decided to be significant, substantial, or relevant, the parameter may be included in the selected one or more parameters.

In step 226 of the method illustrated in FIG. 6, the parameters in the subset selected based on differences in the first and second sets of relationship data is compared to the one or more parameters selected based on differences in the first and second sets of frequency data (comp Ps & subset). A determination is made 228 of which parameters are present in both the parameters in the subset and the selected one or more parameters (det Ps). The comparison of the parameters in the subset and the selected one or more parameters leads to a further selection of parameters from the subset of parameters from the second set of data 230 (select Ps from subset). Parameters present in both the parameters in the subset and the selected one or more parameters may be added to the further selection from the subset of parameters. Parameters present in the subset for which no frequency data was available may optionally be added to the further selection from the parameters in the subset. Parameters present in the subset, but not in the selected one or more parameters may be left out of the further selection from parameters in the subset. The determination of the subset of relationships may be additionally based on the further selection from the parameters in the subset, reducing the amount of parameters in the selection has the advantage that it can reduce the amount of relationships in the final subset. The further selected parameters may be used to further select corresponding relationships from the relationships in the subset.

Figure 7A:
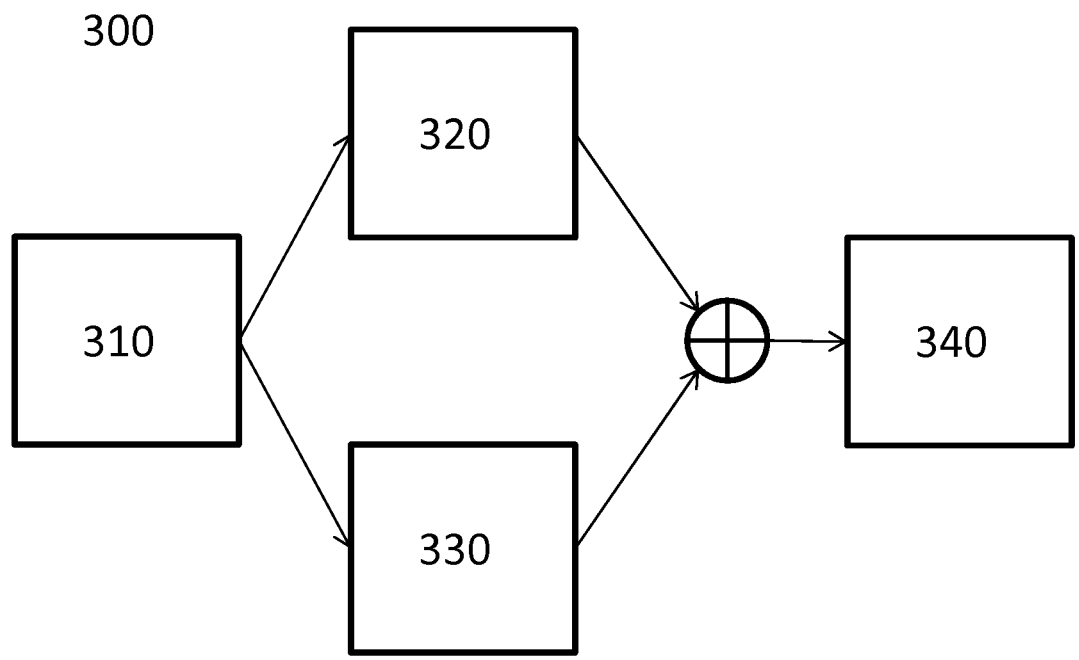
FIG. 7a depicts a flow diagram of a method for comparing relationship data and frequency data independently.
Figure 7B:
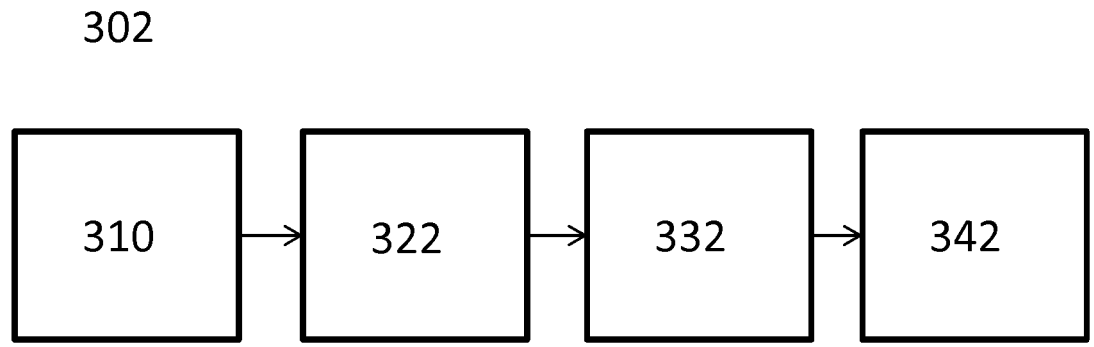
FIG. 7b depicts a flow diagram of a method for comparing relationship data and frequency data in sequence.

The method as described above and illustrated in FIG. 6 corresponds to the analysis structure shown in the flow chart of FIG. 7a. In this method 300, the two sets of data are determined in a step 310, the relationship data comparison 320 and frequency data comparison 330 are performed independently, and the results of the two comparisons are combined, and compared again in step 340 to lead to the subset of parameters. In FIG. 7b the structure of the analysis method 302 starts with the same determination of first and second sets of data in step 310. Method 302 is different to method 300 as it first performs a relationship data comparison 322. Then, the method performs a frequency data analysis 332 and comparison only for the parameters selected as a result of the relationship data comparison. The frequency data for the parameters selected in the subset based on relationship comparison is compared, and used to further select parameters from the subset in step 342.

The method illustrated in FIG. 7b involves determining and selecting a subset of relationships and associated parameters which may be as described in relation to FIG. 6 above. Subsequently, the method involves determining first frequency data and second frequency data for at least one, and in some cases a plurality of the parameters of that subset. The frequency data of the selected parameters of the first and second data sets is compared, and differences in first and second frequency data are determined as described in relation to FIG. 6 above.

Relationships from the subset that have at least one associated parameter with different first and second frequency data are selected for the final subset of relationships. Relationships from the first subset which have no associated parameters with different first and second frequency data may be left out of the final subset of relationships.

An advantage of the combination of the frequency and relationship data comparison, for example as described above, for example according to the methods illustrated in FIGS. 7a and 7b, is that it allows reducing the selection of relationships in the subset to be monitored.

An advantage of the relationship data for parameters in a set is that it shows links between parameters and can therefore provide a clearer view of how different changes are occurring in the system and how they are affecting each other. This might help understand how the parameters are affecting each other and may, for example, help identify if a observed issue is caused by a problem or unusual behaviour of a parameter linked to a different component. An advantage of the frequency data analysis, is that it contains information about the physical systems. It can provide more information about a particular parameter, and might help diagnose the physical causes of the detected change in frequency characteristics. The combination of the analysis of the physical properties and nature of a difference and change in behaviour based on the frequency analysis, with the overview of interconnectedness of the different parameters, provides an advantage for identification, diagnosis, and resolution of issues.

In methods as illustrated by FIGS. 6, 7a, and 7b the first set of data describing relationships between parameters is based on measurements undertaken on the reference apparatus. In some embodiments of the invention, the second set of data describes relationships between parameters of the reference apparatus. The first and second data are therefore related to the same apparatus, here referred to as the reference apparatus. The first set of data may be based on measurements undertaken during a first period of time or set of moments in time. The second set of data may be based on measurements undertaken during a second period of time or set of moments in time. The first period of time or set of moments may fall before the second period of time or set of moments in time. The first and second periods or sets of moments in time may be determined or chosen to not overlap. The comparison of the first and second sets of data may be used to analyse and/or monitor the performance of the apparatus over time, for example to monitor performance of the apparatus over time, or search for and detect errors as they occur in the apparatus.

In some other embodiments according to the invention, the second set of data describes relationships between parameters of a further apparatus. The further apparatus is a different piece of apparatus to the reference apparatus. The further apparatus may be a corresponding apparatus to the reference apparatus, that is to say, the further apparatus may have the same or similar operation to the reference apparatus. The further apparatus may for example, be a copy of the reference apparatus, a different unit of the same type of apparatus as the reference apparatus. The comparison of a further apparatus to a reference apparatus may be for example to compare the performance of a new unit of the apparatus to a known unit of the apparatus, or to monitor performance of the further apparatus against the performance of another apparatus with different properties, for example older, younger, used more, less, or used for different applications.

In another aspect of the invention, the first set of data is based on information relating to a design of the reference apparatus. The information may be based on engineering design knowledge of the apparatus or related apparatus. The first set of data may be calculated from this information. The information may include design information based on properties of the apparatus which have been designed, set, or measured, it may include predictions, calculated properties, and data or measurements taken from other apparatus than the reference apparatus. The first set of data may be a design structure matrix. A design structure matrix for a reference apparatus may encompass a matrix describing a plurality of parameters describing operation of the system, and relationships between the parameters. The second set of data may be based on measurements of a further or reference apparatus, wherein a further apparatus is the same or similar in operation to the reference apparatus, and may be a unit of the same type of apparatus as the reference apparatus. A first relationship data and second relationship data may be compared to determine differences between the first set of data based on obtained information, for example designed and/or predicted parameters and relationships, and the second set of data based on measurements. As part of the comparison between the first and second sets of data, the method will identify differences between the measured second set of data and predicted and/or designed first set of data. The method will select relationships based on these differences, for example relationships which are present in the second set but not in the first set, or relationships which are present in the first set or not in the second set. The selected relationships may be used to improve the first set of data, for example the selected relationships may be monitored or analysed more closely to determine why the predictions and designs do not correspond to the relationships following from the measured data. Alternatively, differences between a design structure matrix and a set of data based on measurements may indicate issues with the apparatus relating to the subset of selected relationships and associated parameters.

A causal graph may be generated from a design structure matrix. The process of generating of a causal graph from a design structure matrix may be automated. The causal graph may be a result of causal inference on available machine data reflecting the same or similar components as in the matrix containing the design knowledge. Techniques including for example transfer entropy or Granger causality may be used for causal inference. The second set of data, calculated based on measurements, may be a causal graph. This measurement-based causal graph may be represented as a matrix, which may be a square matrix. The square matrix may be an adjacency matrix.

A comparison between the design structure matrix and adjacency matrix may identify differences. The differences between a design structure matrix and an adjacency matrix may be represented as true positives, false positives, true negatives, and false negatives. If a design structure matrix is taken as a reference, a true positive indication means that a relationship is contained in the design structure matrix and in the adjacency matrix. A false positive is a relationship that is not found in the design structure matrix but is found in the adjacency matrix. A true negative is a relationship that is not found in either of the design structure matrix and the adjacency matrix, and a false negative is a relationship that is found in the design structure matrix but not in the adjacency matrix. A false negative may be caused by lack of measurement data to determine the existence of a relationship between parameters of the apparatus, and may therefore not necessarily indicate that there is a problem with at least one of the design structure matrix and the measured apparatus.

Further embodiment are disclosed in the subsequent numbered clauses:

1. A method of determining a subset of a plurality of relationships between a plurality of parameters describing operation of an apparatus for use in semiconductor manufacture, the method comprising:

determining a first set of data describing first relationships between a plurality of parameters of a reference apparatus for use in semiconductor manufacture;

based on one or more measurements, determining a second set of data describing second relationships between the plurality of parameters of the reference or a further apparatus for use in semiconductor manufacture;

comparing the first set of data and the second set of data; and selecting from the second set of data a subset of the second relationships based on differences between the first set of data and the second set of data.

2. A method according to clause 1, wherein one or more of the relationships are causal relationships.

3. A method according to any preceding clause, wherein the first set of data is based on a first set of one or more measurements undertaken on the reference apparatus for use in semiconductor manufacture, and wherein the second set of data is based on a second set of one or more measurements undertaken on the reference or the further apparatus for use in semiconductor manufacture.

4. A method according to clause 3, wherein the method further comprises calculating, based on the first set of one or more measurements, first frequency data relating to one or more of the plurality of parameters of the reference apparatus for use in semiconductor manufacture, and calculating, based on the second set of one or more measurements, second frequency data relating to one or more of the plurality of parameters of the reference or the further apparatus for use in semiconductor manufacture.

5. A method according to clause 4, wherein the method further comprises comparing the first frequency data to the second frequency data, and selecting one or more parameters of the plurality of parameters of the reference or further apparatus for use in semiconductor manufacture based on the comparison between the first frequency data and the second frequency data.

6. A method according to clause 5 wherein a parameter is selected if a difference between the first frequency data and the second frequency data for that parameter is greater than a threshold value.

7. A method according to clause 5 or 6, wherein selecting the subset of the second relationships further comprises determining, from the second set of data, one or more relationships relating to at least one of the selected parameters of the reference or further apparatus.

8. A method according to any of clauses 4-7, wherein the first frequency data and second frequency data are calculated based on a result of the comparison of the first set of data and the second set of data.

9. A method according to any preceding clause wherein the second set of data relates to the reference apparatus at a different time to the first set of data.

10. A method according to any preceding clause, wherein the second set of data relates to the further apparatus for use in semiconductor manufacture, and wherein the further apparatus for use in semiconductor manufacture is an apparatus corresponding to the reference apparatus for use in semiconductor manufacture.

11. A method according to clause 10, wherein the first set of data is calculated based on information relating to a design of the reference apparatus for use in semiconductor manufacture.

12. A method according to clause 11, wherein the first set of data comprises a design structure matrix.

13. A method according to any of preceding clause, wherein one of the first and/or second sets of data comprises at least one of a causal graph and data stored in respective matrices.

14. A computer program comprising instructions which, when executed on at least one processor, cause the at least one processor to control an apparatus to carry out a method according to any one of clauses 1 to 13.

15. An apparatus for determining a subset of a plurality of relationships between a plurality of parameters describing operation of an apparatus for use in semiconductor manufacture, the apparatus comprising a processor configured to execute computer program code to undertake the method of:

determining a first set of data describing first relationships between a plurality of parameters of a reference apparatus for use in semiconductor manufacture;

based on one or more measurements, determining a second set of data describing second relationships between the plurality of parameters of the reference or a further apparatus for use in semiconductor manufacture;

comparing the first set of data and the second set of data; and selecting from the second set of data a subset of the second relationships based on differences between the first set of data and the second set of data.

16. An apparatus for use in semiconductor manufacture comprising the apparatus of clause 15.

17. A lithographic cell system comprising the apparatus for use in semiconductor manufacture of clause 16.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions Although specific reference may have been made above to the use of embodiments of the invention in the context of optical lithography, it will be appreciated that the invention, where the context allows, is not limited to optical lithography and may be used in other applications, for example imprint lithography.

Although specific reference is made in this text to "metrology apparatus" or "inspection apparatus", both terms may also refer to an inspection apparatus or an inspection system. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining a subset of a plurality of relationships between a plurality of parameters describing an operation of an apparatus for use in semiconductor manufacture, the method comprising:
   determining a first set of data describing first relationships between the plurality of parameters of a reference apparatus for use in semiconductor manufacture, wherein the plurality of parameters comprises temperature, pressure, flow, humidity, voltage, current, velocities, accelerations, or torque;
   based on one or more measurements, determining a second set of data describing second relationships between the plurality of parameters of the reference or a further apparatus for use in semiconductor manufacture;
   comparing the first set of data and the second set of data and identifying differences between the first set of data and the second set of data, wherein the differences comprise true positives, false positives, true negatives, or false negatives;
   selecting from the second set of data, a subset of the second relationships based on the differences between the first set of data and the second set of data; and
   modifying a further operation of the apparatus or the further apparatus.

2. The method of claim 1, wherein one or more of the relationships are causal relationships.

3. The method of claim 1, wherein the first set of data is based on a first set of one or more measurements undertaken on the reference apparatus for use in semiconductor manufacture, and wherein the second set of data is based on a second set of one or more measurements undertaken on the reference or the further apparatus for use in semiconductor manufacture.

4. The method of claim 3, wherein the method further comprises calculating, based on the first set of one or more measurements, first frequency data relating to one or more of the plurality of parameters of the reference apparatus for use in semiconductor manufacture, and
   calculating, based on the second set of one or more measurements, second frequency data relating to one or more of the plurality of parameters of the reference or the further apparatus for use in semiconductor manufacture.

5. The method according to claim 4, wherein the method further comprises comparing the first frequency data to the second frequency data, and selecting one or more parameters of the plurality of parameters of the reference or further apparatus for use in semiconductor manufacture based on the comparison between the first frequency data and the second frequency data.

6. The method of claim 5, wherein a parameter is selected if a difference between the first frequency data and the second frequency data for that parameter is greater than a threshold value.

7. The method of claim 5, wherein selecting the subset of the second relationships further comprises determining, from the second set of data, one or more relationships relating to at least one of the selected parameters of the reference or further apparatus.

8. The method of claim 4, wherein the first frequency data and second frequency data are calculated based on a result of the comparison of the first set of data and the second set of data.

9. The method of claim 1, wherein the second set of data relates to the reference apparatus at a different time to the first set of data.

10. The method of claim 1, wherein the second set of data relates to the further apparatus for use in semiconductor manufacture, and wherein the further apparatus for use in semiconductor manufacture is an apparatus corresponding to the reference apparatus for use in semiconductor manufacture.

11. The method of claim 10, wherein the first set of data is calculated based on information relating to a design of the reference apparatus for use in semiconductor manufacture.

12. The method of claim 11, wherein the first set of data comprises a design structure matrix.

13. The method of claim 1, wherein one of the first and/or second sets of data comprises at least one of a causal graph and data stored in respective matrices.

14. A computer program comprising instructions which, when executed on at least one processor, cause the at least one processor to control an apparatus to carry out the method of claim 1.

15. An apparatus for determining a subset of a plurality of relationships between a plurality of parameters describing an operation of an apparatus for use in semiconductor manufacture, the apparatus comprising a processor configured to execute computer program code to undertake the method of:
   determining a first set of data describing first relationships between the plurality of parameters of a reference apparatus for use in semiconductor manufacture, wherein the plurality of parameters comprises temperature, pressure, flow, humidity, voltage, current, velocities, accelerations, or torque;
   based on one or more measurements, determining a second set of data describing second relationships between the plurality of parameters of the reference or a further apparatus for use in semiconductor manufacture;
   comparing the first set of data and the second set of data and identifying differences between the first set of data and the second set of data, wherein the differences comprise true positives, false positives, true negatives, or false negatives;
   selecting from the second set of data, a subset of the second relationships based on the differences between the first set of data and the second set of data, and
   modifying a further operation of the apparatus or the further apparatus.

* * * * *